(12) United States Patent
Ozaki et al.

(10) Patent No.: US 10,578,214 B2
(45) Date of Patent: *Mar. 3, 2020

(54) PISTON RING AND MANUFACTURING METHOD THEREFOR

(71) Applicant: NIPPON PISTON RING CO., LTD., Saitama-shi, Saitama (JP)

(72) Inventors: Takuya Ozaki, Ichinoseki (JP); Hiroyuki Sugiura, Ichinoseki (JP)

(73) Assignee: NIPPON PISTON RING CO., LTD, Saitama-shi, Saitama (JP)

( * ) Notice: Subject to any disclaimer, the term of this patent is extended or adjusted under 35 U.S.C. 154(b) by 161 days.

This patent is subject to a terminal disclaimer.

(21) Appl. No.: 15/739,344

(22) PCT Filed: Jul. 29, 2016

(86) PCT No.: PCT/JP2016/072292
§ 371 (c)(1),
(2) Date: Dec. 22, 2017

(87) PCT Pub. No.: WO2017/022660
PCT Pub. Date: Feb. 9, 2017

(65) Prior Publication Data
US 2018/0180181 A1 Jun. 28, 2018

(30) Foreign Application Priority Data
Jul. 31, 2015 (JP) .................................. 2015-152670

(51) Int. Cl.
*F16J 9/26* (2006.01)
*F02F 5/00* (2006.01)
(Continued)

(52) U.S. Cl.
CPC ............. *F16J 9/26* (2013.01); *C23C 14/0605* (2013.01); *C23C 14/325* (2013.01); *C23C 14/54* (2013.01); *F02F 5/00* (2013.01)

(58) Field of Classification Search
USPC .................. 277/442; 427/577; 428/212, 408
See application file for complete search history.

(56) References Cited

U.S. PATENT DOCUMENTS

2008/0220257 A1* 9/2008 Dekempeneer ..... C23C 16/0272
428/408
2009/0011225 A1 1/2009 Moronuki et al.
(Continued)

FOREIGN PATENT DOCUMENTS

EP           2851451     *   3/2015
JP      2000-128516 A      5/2000
(Continued)

OTHER PUBLICATIONS

Extended European Search Report dated Jun. 14, 2018 issued by the European Patent Office in counterpart European application No. 16832939.9.
(Continued)

*Primary Examiner* — Archene A Turner
(74) *Attorney, Agent, or Firm* — Sughrue Mion, PLLC

(57) ABSTRACT

To provide a piston ring comprising a hard carbon film that is easy to form and exhibits excellent adhesion and wear resistance, and a manufacturing method therefor. The above-described problem is solved by means of a piston ring comprising a hard carbon film 50 formed on at least an outer peripheral sliding surface 11 of a piston ring base material 1, wherein the hard carbon film 50 is a laminated film comprising a plurality of layers, including an upper layer 5 with a lamination pitch within a range of 3 nm to 50 nm inclusive, a middle layer 4 with a lamination pitch less than that of the upper layer 5, and a lower layer 3 with a lamination pitch within the same range as that of the upper layer 5 and greater than that of the middle layer 4. This hard carbon film 50 may be configured to have an $sp^2$ component ratio within a range of 35% to 80% inclusive, measured in a TEM-EELS spec-
(Continued)

trum formed by combining electron energy loss spectroscopy (EELS) with a transmission electron microscope (TEM), and a hydrogen content within a range of 0.1 atom % to 5 atom % inclusive.

8 Claims, 7 Drawing Sheets

(51) Int. Cl.
    *C23C 14/06*     (2006.01)
    *C23C 14/32*     (2006.01)
    *C23C 14/54*     (2006.01)

(56) References Cited

U.S. PATENT DOCUMENTS

| | | |
|---|---|---|
| 2012/0248711 A1 | 10/2012 | Iwashita et al. |
| 2015/0137457 A1 | 5/2015 | Iwashita et al. |
| 2016/0238133 A1 | 8/2016 | Sato et al. |
| 2017/0002454 A1* | 1/2017 | Ozaki .................. C23C 14/025 |

FOREIGN PATENT DOCUMENTS

| | | | |
|---|---|---|---|
| JP | 2000-320673 A | | 11/2000 |
| JP | 2002-322555 | * | 11/2002 |
| JP | 2003-26414 A | | 1/2003 |
| JP | 2007-169698 A | | 7/2007 |
| JP | 2008-001951 | * | 1/2008 |
| JP | 2008-297477 A | | 12/2008 |
| JP | 2012-202522 A | | 10/2012 |
| JP | 2015-86967 A | | 5/2015 |

OTHER PUBLICATIONS

International Search Report for PCT/JP2016/072292, dated Sep. 6, 2016 (PCT/ISA/210).
Written Opinion of the International Searching Authority for PCT/JP2016/072292, dated Sep. 6, 2016 (PCT/ISA/237).

* cited by examiner

10(10B)

PISTON RING AND MANUFACTURING METHOD THEREFOR

CROSS REFERENCE TO RELATED APPLICATIONS

This application is a National Stage of International Application No. PCT/JP2016/072292 filed Jul. 29, 2016, claiming priority based on Japanese Patent Application No. 2015-152670, filed Jul. 31, 2015, the contents of all of which are incorporated herein by reference in their entirety.

FIELD OF THE INVENTION

The present invention relates to a piston ring provided with a hard carbon film exhibiting excellent adhesion and wear resistance, and a manufacturing method therefor.

BACKGROUND ART

Piston rings used in internal combustion engines have been increasingly used under harsh high-temperature, high-pressure environments in recent years. Such piston rings demand further improvement in wear resistance, initial running-in property, low friction, and the like. In response to such demands, Patent Document 1, for example, proposes a piston ring provided with a carbon-based coating exhibiting low friction and wear resistance. Specifically, Patent Document 1 proposes a piston ring having a laminated coating comprising two types of layers with different hardnesses laminated in at least two layers, a hardness difference between the two types of layers being 500 to 1700 HV, a high hardness layer having a thickness greater than or equal to that of a low hardness layer, and the coating as a whole having a thickness of 5.0 μm or greater. At this time, the low hardness layer is formed by sputtering, and the high hardness layer is formed by ion plating.

Further, Patent Document 2 proposes a piston ring having an amorphous hard carbon coating excellent in adhesion to a piston ring base material, high in hardness, and excellent in wear resistance. Specifically, Patent Document 2 proposes a piston ring having a first amorphous hard carbon layer formed on a surface of the piston ring base material and substantially comprising only carbon without hardly any hydrogen, and a second amorphous hard carbon layer formed on a surface of the first amorphous hard carbon layer and substantially comprising only carbon. When viewed from a cross section, a transmission electron microscopic image of the first amorphous hard carbon layer is brighter than that of the second amorphous hard carbon layer.

PATENT DOCUMENTS

Patent Document 1: Japanese Laid-Open Patent Application No. 2012-202522
Patent Document 2: Japanese Laid-Open Patent Application No. 2007-169698

SUMMARY OF THE INVENTION

Problems to be Solved by the Invention

Nevertheless, the technology of Patent Document 1 is a multi-layered structure having layers of different hardnesses alternately repeatedly laminated by different film-forming means, making formation of the film complex. Further, with the high hardness layer having a thickness of 5 nm to 90 nm, the high hardness layer cannot always be maintained, making it difficult to maintain wear resistance. Furthermore, while the technology of Patent Document 2 describes the relationship between brightness of the transmission electron microscopic image and density as well as adhesion with the base material, whether or not the layers are amorphous hard carbon layers high in hardness and excellent in wear resistance had not been adequately studied.

The present invention was made to resolve the above-described problems, and it is therefore an object of the present invention to provide a piston ring comprising a hard carbon film that is easy to form and exhibits excellent adhesion and wear resistance, and a manufacturing method therefor.

Means for Solving the Problems

A piston ring according to the present invention for resolving the above-described problems comprises a hard carbon film formed on at least an outer peripheral sliding surface of a piston ring base material. The hard carbon film is a laminated film comprising a plurality of layers, including a lower layer with a lamination pitch within a range of 3 nm to 50 nm inclusive, a middle layer with a lamination pitch less than that of the lower layer, and an upper layer with a lamination pitch within the same range as that of the lower layer and greater than that of the middle layer, from the piston ring base material side.

According to this present invention, the hard carbon film is a laminated film comprising a plurality of layers, including the upper layer, the middle layer, and the lower layer with the lamination pitches within the above-described ranges, making it possible to improve film toughness by the upper layer. Further, the middle layer having a lamination pitch less than those of the upper layer and the lower layer is provided between these, making it possible to improve adhesion by an interface action between each of the layers. As a result, a piston ring comprising a hard carbon film excellent in adhesion and wear resistance can be achieved.

In the piston ring according to the present invention, the hard carbon film may be configured to have an $sp^2$ component ratio within a range of 35% to 80% inclusive, measured in a TEM-EELS spectrum formed by combining electron energy loss spectroscopy (EELS) with a transmission electron microscope (TEM), and a hydrogen content within a range of 0.1 atom % to 5 atom % inclusive. According to this invention, it is possible to provide a piston ring excellent in wear resistance.

In the piston ring according to the present invention, an $sp^2$ component ratio of the upper layer is greater than an $sp^2$ component ratio of the lower layer, and an $sp^3$ component ratio of the upper layer is less than an $sp^3$ component ratio of the lower layer.

In the piston ring according to the present invention, a lamination pitch of the middle layer may be configured to be less than the lamination pitches of the upper layer and the lower layer, and within a range of 0.1 nm to 5 nm inclusive.

In the piston ring according to the present invention, an amount of macroparticles appearing on a surface of the hard carbon film may be configured to be within a range of 0.1% to 10% inclusive by area ratio.

According to this invention, the amount of macroparticles appearing on the surface is within the above-described range by area ratio, and thus an unevenness of the surface is small. As a result, surface smoothing treatment such as, for example, lapping or buffing, performed as final machining is no longer necessary, making it possible to provide a piston ring at low cost.

In the piston ring according to the present invention, a hardness of the upper layer constituting the hard carbon film may be configured to be within a range of 10 GPa to 20 GPa inclusive at an indentation hardness $H_{IT}$ (15-mN load) when measured by a nanoindentation method.

A manufacturing method for a piston ring according to the present invention for solving the above-described problems is a method for manufacturing a piston ring comprising a hard carbon film that is a laminated film formed on at least an outer peripheral sliding surface of a piston ring base material by a physical vapor deposition method, the manufacturing method for a piston ring comprising the steps of forming a lower layer with a lamination pitch within a range of 3 nm to 50 nm inclusive, forming a middle layer with a lamination pitch less than that of the lower layer, and forming an upper layer with a lamination pitch within the same range as that of the lower layer and greater than that of the middle layer.

In the manufacturing method for a piston ring according to the present invention, the upper layer, the middle layer, and the lower layer constituting the hard carbon film may be configured to be formed by alternately applying at least two different bias voltages.

Effect of the Invention

According to the present invention, it is possible to provide a piston ring comprising a hard carbon film that is easy to form and exhibits excellent adhesion and wear resistance, and a manufacturing method therefor.

EMBODIMENTS OF THE INVENTION

The following describes a piston ring and a manufacturing method therefor according to the present invention, with reference to the drawings. The present invention is not limited to the embodiment below as long as the technical characteristics of the present invention are included.

Figure 1:
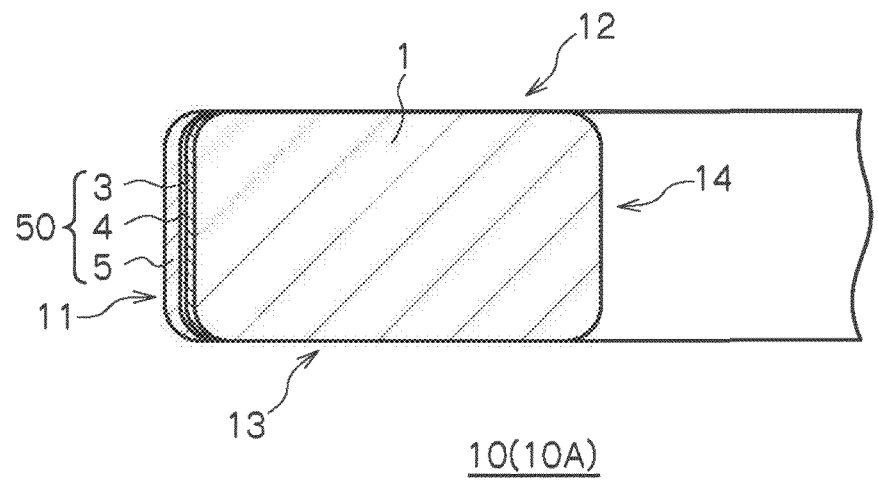
FIG. 1 is a schematic cross-sectional view illustrating an example of a piston ring according to the present invention.
Figure 2:
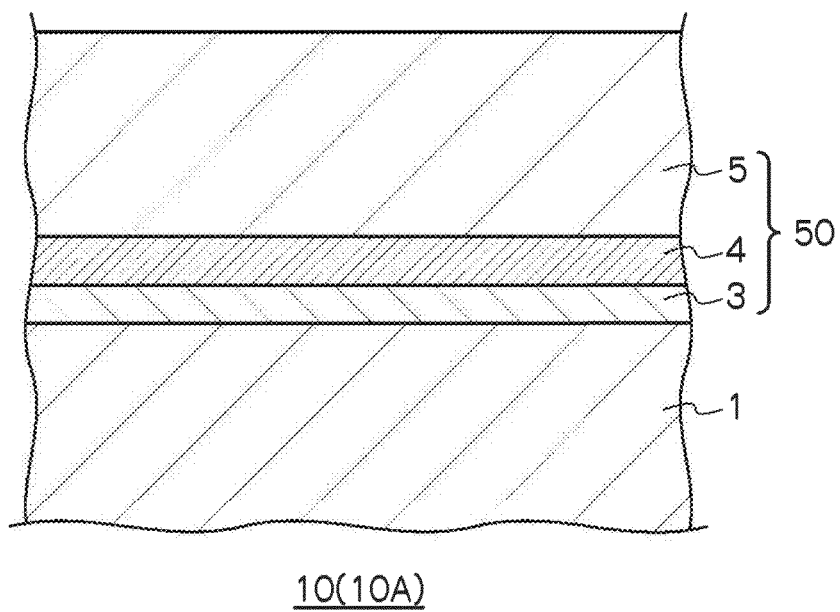
FIG. 2 is a schematic cross-sectional view illustrating an example of a sliding surface of the piston ring according to the present invention.
Figure 3:
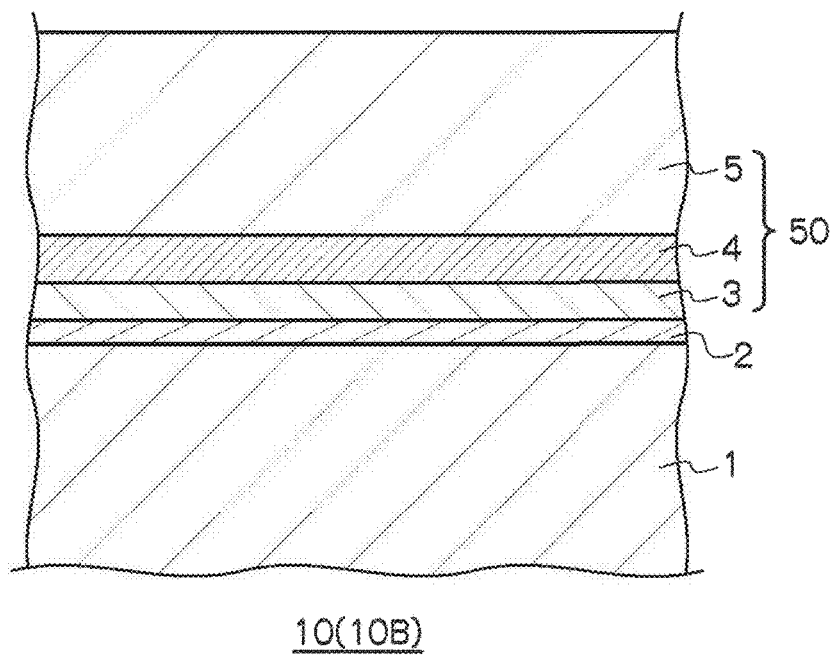
FIG. 3 is a schematic cross-sectional view illustrating another example of the sliding surface of the piston ring according to the present invention.

A piston ring 10 according to the present invention, as illustrated in FIGS. 1 to 3, has a hard carbon film 50 formed on at least an outer peripheral sliding surface 11 of a piston ring base material 1. Then, the hard carbon film 50 is a laminated film comprising a plurality of layers, including a lower layer 3 with a lamination pitch within a range of 3 nm to 50 nm inclusive, a middle layer 4 with a lamination pitch less than that of the lower layer, and an upper layer 5 with a lamination pitch within the same range as that of the lower layer 3 and greater than that of the middle layer 4, from the side of the piston ring base material 1. With such a hard carbon film 50 provided, the piston ring 10 has high adhesion and high wear resistance.

In this hard carbon film 50, an $sp^2$ component ratio measured in a TEM-EELS spectrum is desirably within a range of 35% to 80% inclusive, and a hydrogen content is desirably within a range of 0.1 atom % to 5 atom % inclusive. Furthermore, the amount of macroparticles appearing on the surface is desirably within a range of 0.1% to 10% inclusive by area ratio, in particular, from the viewpoint of wear resistance.

The following describes the components of the piston ring and the manufacturing method therefor in detail.

<Piston Ring Base Material>

For the piston ring base material 1, the materials used as the base material of the piston ring 10 are various and not particularly limited. For example, materials such as various steel materials, stainless steel materials, casting materials, and cast steel materials, can be applied. Among these, examples include a martensitic stainless steel, a spring steel (SUPS, SUP10), a silicon chrome steel (SWOSC-V), and the like.

A nitriding treatment may be performed in advance on the piston ring base material 1 to form a nitride layer (not illustrated). Or, a wear-resistant coating (not illustrated), such as a Cr—N based, Cr—B—N based, Cr—B—V—N based, Cr—B—V—Ti—N based, or Ti—N based film, may be formed in advance. Among these, a Cr—N based, Cr—B—N based, Cr—B—V—N based, or Ti—N based wear-resistant coating is preferably formed. It should be noted that the piston ring 10 according to the present invention exhibits excellent wear resistance even without a nitriding treatment or formation of a Cr or Ti based wear-resistant coating, and thus the nitriding treatment and formation of the Cr or Ti based wear-resistant coating are not necessarily required.

The piston ring base material 1 may be pretreated as necessary. Such a pretreatment is preferably performed by polishing the surface to adjust surface roughness. Adjustment of the surface roughness is preferably performed by, for example, methods such as lapping and polishing the surface of the piston ring base material 1 using diamond abrasive grains. Adjustment of surface roughness makes it possible to adjust the surface roughness of the piston ring base material 1 to within a preferred range of 0.02 μm to 0.07 μm inclusive as an arithmetic mean roughness Ra based on JIS B0601 (2001) and ISO 4287 (1997). The piston ring base material 1 thus adjusted can be preferably applied as a pretreatment before formation of the lower layer 3 described later, or as a pretreatment for a foundation film 2 provided in advance before formation of the lower layer 3.

<Foundation Film>

The foundation film 2 comprising titanium, chromium, or the like may be provided to the piston ring base material 1, as illustrated in FIG. 3. The foundation film 2 does not necessarily have to be provided, and thus formation is optional. The foundation film 2 comprising titanium, chromium, or the like may be formed by various film-forming means. For example, the foundation film 2 comprising titanium, chromium, or the like may be formed by applying film-forming means such as a vacuum deposition method, a sputtering method, and an ion plating method. While a thickness of the foundation film 2 is not particularly limited, a thickness within a range of 0.05 μm to 2 μm inclusive is preferred. Note that the foundation film 2 is preferably formed on at least the outer peripheral sliding surface 11 on which the piston ring 10 slides upon contact with a cylinder liner (not illustrated). However, the foundation film 2 may be formed on one or two or more other surfaces such as, for example, a top surface 12, a bottom surface 13, and an inner peripheral surface 14 of the piston ring 10, or on all other surfaces.

The foundation film 2 can be formed by means such as a vacuum depositing method or an ion plating method for setting the piston ring base material 1 into a chamber, creating a vacuum in the chamber, performing pre-heating, ion cleaning, and the like, and introducing an inert gas, for example.

This foundation film 2, as illustrated in FIG. 3, may be directly formed on the piston ring base material 1. The lower layer 3 described later is desirably formed on the foundation film 2. The foundation film 2 improves the adhesion between the piston ring base material 1 and the lower layer 3 (the hard carbon film 50 comprising the lower layer 3, the middle layer 4, and the upper layer 5) and, by forming the lower layer 3 on the foundation film 2, can further suppress nucleation and nuclear growth when the lower layer 3 is formed at low speed. As a result, after film formation of the middle layer 4 and the upper layer 5 on the lower layer 3, the upper layer 5 can be formed as a smooth film having little surface unevenness.

<Hard Carbon Film>

The hard carbon film 50 is a laminated film comprising a plurality of layers, as illustrated in FIGS. 1 to 3. The hard carbon film 50 comprises the lower layer 3 with a lamination pitch within the range of 3 nm to 50 nm inclusive, the middle layer 4 with a lamination pitch less than that of the lower layer 3, and the upper layer 5 with a lamination pitch within the same range as that of the lower layer 3 and greater than that of the middle layer 4. It should be noted that the hard carbon film 50 and the lower layer 3, the middle layer 4, and the upper layer 5 that constitute the hard carbon film 50 are also called amorphous carbon films. In the following, the lower layer 3, the middle layer 4, and the upper layer 5 will be described in that order.

(Lower Layer)

The lower layer 3 is provided on the piston ring base material 1. Specifically, the lower layer 3 is formed on at least the piston ring base material surface (outer peripheral sliding surface side) on the side on which the piston ring 10 slides upon contact with a cylinder liner (not illustrated). However, the lower layer 3 may be optionally formed on one or two or more other surfaces such as, for example, the top surface 12, the bottom surface 13, and the inner peripheral surface 14 of the piston ring 10, or on all other surfaces.

The lower layer 3, as illustrated in FIGS. 1 and 2, may be directly provided on the piston ring base material 1, may be provided on the above-mentioned surface after the nitriding treatment or wear-resistant coating, or may be provided on the above-mentioned foundation film 2 comprising a titanium film or the like, as illustrated in FIG. 3. It should be noted that the middle layer 4 and the upper layer 5 described later are preferably provided directly on the lower layer 3 without another film being interposed therebetween in that order.

The lower layer 3 is a laminated film with an extremely thin thickness per layer and, similar to the upper layer 5 described later, a lamination pitch within the range of 3 nm to 50 nm inclusive. That is, the thickness per layer is within the range of 3 nm to 50 nm inclusive. Film formation of the middle layer 4 and the upper layer 5 described later on the lower layer 3 laminated at an extremely small lamination pitch makes it possible to achieve excellent adhesion and excellent wear resistance. The lamination pitch (thickness per layer) can be measured using a transmission electron microscope (TEM).

The total thickness of the lower layer 3 is preferably within a range of 0.1 μm to 0.6 μm inclusive. Forming the lower layer 3 laminated at the lamination pitch described above (3 nm to 50 nm inclusive) within this range of total thickness makes it possible to preferably cause the lower layer 3 to act as an adhesive film with respect to the piston ring base material 1. With a total thickness less than 0.1 μm, the lower layer 3 is too thin, possibly resulting in inadequacies as an adhesive film. Even when the total thickness exceeds 0.6 μm, increasing the action of the lower layer 3 as an adhesive film becomes remarkably difficult, and a so-called saturated state is reached.

An $sp^2$ component ratio of the lower layer 3, while described in detail in the upper layer 5 section, is desirably less than an $sp^2$ component ratio of the upper layer 5, and an $sp^3$ component ratio of the lower layer 3 is desirably greater than an $sp^3$ component ratio of the upper layer 5. Establishing such a relationship between the $sp^2$ component ratios and the $sp^3$ component ratios of the lower layer 3 and the upper layer 5 makes it possible to achieve high adhesion and excellent wear resistance.

The lower layer 3 is a hard carbon film comprising the same components as those of the other middle layer 4 and upper layer 5 constituting the hard carbon film 50. The lower layer 3 can be formed by film-forming means such as an ion plating method based on vacuum arc discharge using a carbon target. For example, when the lower layer 3 is formed by an ion plating method based on vacuum arc discharge (hereinafter "arc ion plating method"), film formation can be achieved specifically by setting the piston ring base material 1 or the piston ring base material 1 provided with the wear-resistant coating, the foundation film 2, or the like in advance into a chamber, creating a vacuum in the chamber, and discharging carbon plasma from the carbon target.

The lower layer 3, compared to the film-forming conditions of the upper layer 5, is desirably formed by performing control so as to decrease the film-forming speed. That is, the lower layer 3, compared to the upper layer 5, is desirably formed under low-speed film-forming conditions. Examples of methods for decreasing such a film-forming condition include means for decreasing the arc current and the bias voltage in an arc ion plating method. For example, film formation is preferably performed by making the arc current within a range of 40 A to 100 A and less than the arc current of the upper layer 5, and making the pulse bias voltage within a range of −2000 V to −100 V and less than the bias voltage of the upper layer 5. Forming the lower layer 3 under such film-forming conditions makes it possible to establish the above-described relationship between the $sp^2$ component ratios and $sp^3$ component ratios of the lower layer 3 and the upper layer 5 and achieve high adhesion and excellent wear resistance.

When decreased, the arc current is preferably set to an arc current value that is 80% or less of the arc current value during formation of the upper layer 5. The arc current value at this time preferably is given a lower limit of 50% of the arc current value during formation of the upper layer 5. Further, when decreased, the bias voltage is preferably set to a bias voltage that is 10% or less of the bias voltage during formation of the upper layer 5. The bias voltage at this time preferably is given a lower limit of 5% of the bias voltage during formation of the upper layer 5.

Furthermore, forming the lower layer 3 under the film-forming conditions described above also offers the advantage of making it possible to suppress adhesion defects caused by sudden increases in arc current, which readily occur when the upper layer 5 and the middle layer 4 are formed without forming the lower layer 3 on the piston ring base material 1. Further, film formation of the lower layer 3 by a small arc current and a small bias voltage, which are low-speed film-forming conditions, also offers the advantage of making it possible to suppress nucleation as well as nuclear growth, and suppress increases in macroparticles. Suppression of increases in macroparticles facilitates formation of the upper layer 5 described later as a smooth film unaffected by the lower layer 3 and having little surface unevenness. As a result, wear resistance can be improved.

The hardness of the lower layer 3 is within a range of about 2000 HV to 4000 HV (0.05) by Vickers hardness. It should be noted that, with the lower layer 3 being extremely thin, resulting in difficulties in Vickers hardness measurement, evaluation was performed by Vickers hardness (JIS B7725, ISO 6507) with the layer thickly formed to about 5 μm under the same film-forming conditions. The measurement can be made using a Vickers hardness tester (manufactured by Future-Tech) or the like. "HV (0.05)" indicates the Vickers hardness at a load of 50 gf. Further, when the hardness of this lower layer 3 is measured by a nanoindentation method, the hardness is within a range of 20 GPa to 45 GPa inclusive at an indentation hardness $H_{IT}$ (15-mN load) thereof. Measurement by the nanoindentation method can be made using a nanoindenter manufactured by Elionix, for example.

(Middle Layer)

The middle layer 4, as illustrated in FIGS. 1 to 3, is directly provided between the lower layer 3 and the upper layer 5 without any other layer therebetween. The middle layer 4 is also a laminated film similar to the lower layer 3, and has a thickness per layer that is even thinner than those of the lower layer 3 and the upper layer 5, and a lamination pitch less than that of the lower layer 3 and within a range of 0.1 nm to 5 nm inclusive. That is, the thickness per layer is within the range of 0.1 nm to 5 nm inclusive. Providing the middle layer 4 laminated at an extremely small lamination pitch between the lower layer 3 and the upper layer 5 makes it possible to alleviate a stress concentration in the lower layer 3 formed on the interface of the piston ring base material 1, remarkably increase adhesion between the upper layer 5 and the lower layer 3, and achieve excellent wear resistance. The lamination pitch (thickness per layer) can be measured using a transmission electron microscope (TEM).

The total thickness of the middle layer 4 is preferably provided greater than the total thickness of the lower layer 3, and less than the total thickness of the upper layer 5. The total thickness of the middle layer 4 is preferably within a range of 0.2 μm to 1.6 μm inclusive. The middle layer 4 acts so as to alleviate the stress concentrated in the lower layer 3 formed on the interface of the piston ring base material 1. When the middle layer 4 is formed, making the lamination pitch less than those of the lower layer 3 and the upper layer 5, and the total thickness greater than that of the lower layer 3 and within the above-described range of the total thickness (0.2 μm to 1.6 μm inclusive), makes it possible to alleviate the stress concentration in the lower layer 3 formed on the interface of the piston ring base material 1. With a total thickness less than 0.2 μm, the thickness is too thin, possibly resulting in inadequate alleviation of the stress concentration in the lower layer 3 and the inability to achieve sufficient adhesion. Even when the total thickness exceeds 1.6 μm, increasing the effect of alleviating the stress concentration in the lower layer 3 becomes remarkably difficult, and a so-called saturated state is reached.

The middle layer 4 is also the same hard carbon film as that of the lower layer 3 described above, and can be formed by film-forming means such as an ion plating method based on vacuum arc discharge using a carbon target, similar to the case of the lower layer 3 described above. The middle layer 4 is preferably formed under intermediate film-forming conditions between those of the lower layer 3 and the upper layer 5. As an example of intermediate conditions, preferably the film-forming conditions of the lower layer 3 (bias voltage and the like, for example) and the film-forming conditions of the upper layer 5 (bias voltage and the like, for example) may be alternately applied to obtain a laminated film. For example, the lower layer 3 may be formed by decreasing the bias voltage, the arc current value, and the film-forming speed further than those of the upper layer 5. Thus, the middle layer 4 is preferably formed by alternately applying a low bias voltage during film formation of the lower layer 3, for example, and a high bias voltage during film formation of the upper layer 5, for example.

The film-forming conditions of the middle layer 4, as long as intermediate film-forming conditions between the film-forming conditions of the lower layer 3 and the film-forming conditions of the upper layer 5, may be gradient film-forming conditions in which the film-forming conditions are gradually changed. As a result, the middle layer 4 may be an intermediate gradient film between the lower layer 3 and the upper layer 5.

The middle layer 4 has a lamination pitch that is significantly smaller than those of the lower layer 3 and the upper layer 5, and thus the applied time of the pulse bias voltage is small compared to those of the lower layer 3 and the upper layer 5. This makes it possible to form the middle layer 4 with a lamination pitch per layer within the above-described range.

The hardness of the middle layer 4 is within a range of about 1500 HV to 2500 HV (0.05) by Vickers hardness. It should be noted that, similar to the case of the lower layer 3, with the middle layer 4 being too thin, resulting in difficulties in Vickers hardness measurement, evaluation was performed by Vickers hardness (JIS B7725, ISO 6507) with the layer thickly formed to about 5 μm under the same film-forming conditions. When the hardness of this middle layer 4 is measured by a nanoindentation method in the same way as described above, the hardness is within a range of 15 GPa to 25 GPa inclusive at an indentation hardness $H_{IT}$ (15-mN load) thereof.

(Upper Layer)

The upper layer 5, as illustrated in FIGS. 1 to 3, is directly provided on the middle layer 4 without any other layer therebetween. The upper layer 5 is also a laminated film, similar to the lower layer 3 and the middle layer 4. With regard to the thickness per layer of the upper layer 5, similar to the case of the lower layer 3, the lamination pitch is within the same range as that of the lower layer 3 and greater than that of the middle layer 4. Specifically, the thickness per layer of the upper layer 5 is within the range of 3 nm to 50 nm inclusive. With the upper layer 5 laminated at an extremely small lamination pitch provided on the above-mentioned lower layer 3 and the middle layer 4, the hard carbon film 50 (the lower layer 3, the middle layer 4, and the upper layer 5) that includes this upper layer 5 can achieve excellent adhesion and excellent wear resistance. The lamination pitch (thickness per layer) can be measured using a transmission electron microscope (TEM).

The total thickness of the upper layer 5 is preferably within a range of 0.4 μm to 20 μm inclusive. The upper layer 5 is provided on the surface side of the lower layer 3 and the middle layer 4, and thus is desirably formed so that the total thickness is greater than those of the lower layer 3 and the middle layer 4. When the upper layer 5, which is the outermost surface of the hard carbon film 50, wears, the stress concentrates in the lower layer 3 formed on the interface of the piston ring base material 1. However, in the present invention, the middle layer 4 that alleviates the stress concentration in the lower layer 3 is formed at the above-described lamination pitch and the above-described total thickness below the upper layer 5, making it possible to alleviate the stress concentration in the lower layer 3 formed on the interface of the piston ring base material 1, and increase the adhesion of the hard carbon film 50. It should be noted that, with a total thickness of the upper layer 5 less than 0.4 μm, the thickness is too thin, resulting in an inadequate thickness as a wear-resistant film. On the other hand, when the total thickness of the upper layer 5 exceeds 20 μm, the film-forming time increases, resulting in an increase in cost. Further, an increase in thickness to such an extent is often not required.

The $sp^2$ component ratio of the upper layer 5 is desirably greater than the $sp^2$ component ratio of the lower layer 3, and the $sp^3$ component ratio of the upper layer 5 is desirably less than the $sp^3$ component ratio of the lower layer 3. Establishing such an $sp^2$ component ratio and an $sp^3$ component ratio in the upper layer 5 makes it possible to achieve high adhesion and excellent wear resistance.

It should be noted that a "hard carbon film" is a film in which a carbon bond $sp^2$ represented by graphite and a carbon bond $sp^3$ represented by diamond are mixed together. An "$sp^2$ component ratio" expresses the component ratio ($sp^2/(sp^2+sp^3)$) of the graphite component ($sp^2$) to the graphite component ($sp^2$) and the diamond component ($sp^3$) of the hard carbon film. The hard carbon film can be measured by a TEM-EELS formed by combining electron energy loss spectroscopy (EELS) with a transmission electron microscope (TEM). Such a covalent bond ratio can be measured using an EELS analyzer (manufactured by Gatan; model 863GIF Tridiem). This measurement can be made by the steps below.

(1) The EELS spectrum is measured by the EELS analyzer. The pre-peak area is fit using a linear function, and the post-peak area is fit using a cubic function to the measured EELS spectrum to standardize the peak intensity. (2) Subsequently, the diamond data and the graphite data are compared, and the energy is calibrated with the peak start position aligned. (3) The surface area within a range of 280 eV to 310 eV is found for the calibrated data. (4) The area is divided into two peaks (one being an $sp^2$ peak and the other being a CH and an amorphous peak) within a range of 280 eV to 295 eV, and the peak area near 285 eV is found. (5) The surface area within the 280 eV to 310 eV range of (3) above, and the peak area near 285 eV of (4) above are determined. For this ratio, the $sp^2$ component ratio is found from relative values given a graphite value of 100 and a diamond value of 0. The value thus found is the $sp^2$ component ratio. It should be noted that the $sp^2$ component ratio of the hard carbon film is evaluated upon identifying a plurality of points at an equal interval in the thickness direction of the film as measurement points. While not particularly limited, the number of measurement points may be 10 as described in the examples described later. In the present application, the "$sp^2$ component ratio" obtained by the plurality of measurement points is expressed as an average value of the film.

In the present invention, the $sp^2$ component ratio is preferably within a range of 35% to 80% inclusive for the upper layer 5, the middle layer 4, as well as the lower layer 3. An $sp^2$ component ratio of less than 35% results in the diamond component ($sp^3$) being the main component, causing the film to be fine but low in toughness, and therefore is not preferred for formation of a hard carbon film. An $sp^2$ component ratio that exceeds 80% results in the graphite component ($sp^2$) being the main component, making formation of the hard carbon film difficult, and therefore is not preferred.

Furthermore, in the present invention, while the $sp^2$ component ratios of the upper layer 5, the middle layer 4, and the lower layer 3 are within the above-described range, the $sp^2$ component ratio of the upper layer 5 is greater than the $sp^2$ component ratio of the lower layer 3, within that range. As a result, the $sp^3$ component ratio of the upper layer 5 is relatively less than the $sp^3$ component ratio of the lower layer 3. In the present invention, forming the upper layer 5 and the lower layer 3 under the film-forming conditions described below makes it possible to establish such an $sp^2$ component ratio and an $sp^3$ component ratio relationship between the upper layer 5 and the lower layer 3. This makes it possible to achieve high adhesion and excellent wear resistance.

The upper layer 5 is the same hard carbon film as that of the lower layer 3 and the middle layer 4 described above, and can be formed by the film-forming means, such as an ion plating method based on vacuum arc discharge using a carbon target in the same way as described above. The upper layer 5, while having the same level of lamination pitch as that of the lower layer, is desirably formed by performing control so as to increase the film-forming speed compared to the film-forming conditions of the lower layer 3. That is, the upper layer 5, compared to the lower layer 3, is desirably formed under high film-forming speed conditions. Examples of methods for increasing such a film-forming condition include means for increasing the arc current and the bias voltage in an arc ion plating method. For example, film formation is preferably performed by making the arc current within the range of 40 A to 100 A and greater than the arc current of the lower layer 3, and making the pulse bias voltage within the range of −2000 V to −100 V and greater than the bias voltage of the lower layer 3. Forming the upper layer 5 under such film-forming conditions makes it possible to establish the above-described relationship between the $sp^2$ component ratios and the $sp^3$ component ratios of the upper layer 5 and the lower layer 3 and achieve high adhesion and excellent wear resistance. It should be noted that the relationship between the arc current value of the upper layer 5 and the arc current value of the lower layer 3 is as described in the lower layer 3 section described above, and is therefore omitted here.

As an example, the upper layer 5 is preferably formed by alternately applying at least two different bias voltages in pulses. For example, 1) a predetermined high bias voltage may be turned ON and OFF and applied in pulses, 2) a predetermined low bias voltage and a predetermined high bias voltage may be alternately applied in pulses, 3) a predetermined low bias voltage and a gradually increasing bias voltage may be alternately applied in pulses as pulse bias voltages, and 4) at least two different bias voltages may be alternately applied in pulses. It should be noted that examples of this film formation is not limited to 1) to 4) above, and other examples may be applied. Furthermore, the thickness of the laminated film is set by the repeated count of the pulse bias voltage.

The hard carbon film 50 that includes this upper layer 5 (as well as the above-described lower layer 3 and the middle layer 4) is formed under film-forming conditions that do not substantially cause containment of hydrogen. As a result, hydrogen is contained within a range of 0.1 atom % to 5 atom % inclusive in the upper layer 5, the middle layer 4, as well as the lower layer 3. Thus, this hard carbon film 50 contains just a slight amount of hydrogen in addition to carbon. The hard carbon film 50 can be preferably formed by an arc ion plating method that does not include hydrogen atoms in film-forming raw materials using a carbon target. As a result, the hard carbon film 50 does not contain or substantially does not contain hydrogen components. "Substantially does not contain" means that the hydrogen content in the lower layer 3 and the hard carbon film 50 is 5 atom % or less.

Figure 4:
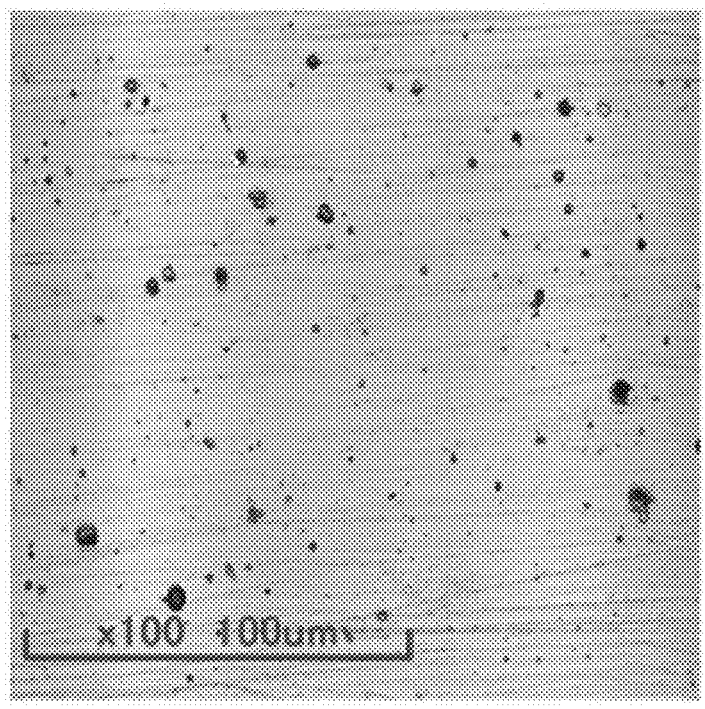
FIG. 4 is a surface image of a hard carbon film of Example 1 showing macroparticles.

Further, with the upper layer 5 provided on the lower layer 3 and the middle layer 4 formed under the film-forming conditions described above, the upper layer 5 can be formed as a smooth film unaffected by the lower layer 3 and having little surface unevenness. The amount of macroparticles appearing on the surface of the upper layer 5 is within a range of 0.1% to 10% inclusive by area ratio. As a result, it is possible to exhibit excellent wear resistance and initial running-in property. When the amount of macroparticles exceeds 10% by area ratio, the unevenness of the surface may increase, making it no longer possible to achieve excellent wear resistance. On the other hand, when the amount of macroparticles is less than 0.1% by area ratio, excellent wear resistance can be achieved. However, film formation in itself may be difficult, and manufacturing control and cost aspects are somewhat problematic. It should be noted that FIG. 4 is a surface image of an upper layer of Example 1 showing macroparticles.

The area ratio of the amount of macroparticles can be found by image analysis using a confocal microscope (OP-TELICS H1200) manufactured by Lasertec. Specifically, an image of the piston ring outer periphery (100× objective lens, monochrome confocal image) was taken and subjected to automatic binarization. The threshold value was determined by a discriminant analysis method, adjustments were made so as to exclude polishing flaws, and then the area ratio was extracted from the binarized image. The area ratio of macroparticles was obtained by measuring any five locations on the film and taking the average of the results.

The hardness of the upper layer 5 is within a range of about 1000 HV to 2000 HV (0.05) by Vickers hardness. It should be noted that, similar to the cases of the lower layer 3 and the middle layer 4, with the upper layer 5 also being thin, resulting in difficulties in Vickers hardness measurement, evaluation was performed by Vickers hardness (JIS B7725, ISO 6507) with the layer thickly formed to about 5 μm under the same film-forming conditions. When the hardness of this upper layer 5 is measured by a nanoindentation method in the same way as described above, the hardness is within a range of 10 GPa to 20 GPa inclusive at an indentation hardness $H_{IT}$ (15-mN load) thereof.

The piston ring 10 provided with the hard carbon film 50 is capable of eliminating coating peeling at gaps hit hard when temperature is applied, and is therefore particularly preferred.

As described above, the hard carbon film 50 comprises the lower layer 3, the middle layer 4, and the upper layer 5, making it possible for the piston ring 10 according to the present invention to achieve high adhesion and high wear resistance. It should be noted that the total thickness of the overall hard carbon film 50 comprising the lower layer 3, the middle layer 4, and the upper layer 5 is preferably within a range of 0.7 μm to 22.2 μm inclusive. The total thickness of the hard carbon film 50 may be within a relatively thin range of 0.7 μm or more and less than 1.3 μm, or within a relatively thick range of 1.3 μm to 22.2 μm inclusive. While the adhesion and the wear resistance can be improved even if the total thickness of the hard carbon film 50 is thin, a thick thickness results in the advantage of further maintaining these effects.

EXAMPLES

The following describes the piston ring according to the present invention in further detail using examples, comparative examples, and conventional examples.

Example 1

The piston ring base material 1 equivalent to a SWOSC-V material in JIS standards, comprising C: 0.55 mass %, Si: 1.35 mass %, Mn: 0.65 mass %, Cr: 0.70 mass %, Cu: 0.03 mass %, P: 0.02 mass %, S: 0.02 mass %, and the remainder being iron and unavoidable impurities, was used. A 30-μm Cr—N coating (wear-resistant coating) was formed by an ion plating method on this piston ring base material 1. The surface roughness was adjusted by lapping and polishing, and a titanium film having a thickness of 0.08 μm was subsequently formed as the foundation film 2 upon introducing an inert gas (Ar) by an ion plating method.

Figure 5A:
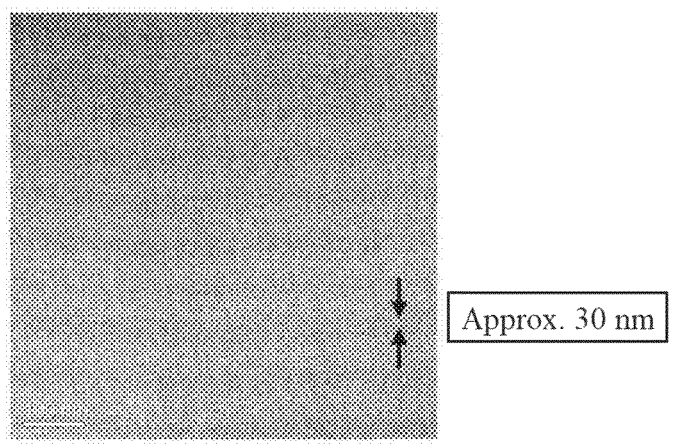
FIGS. 5A, 5B, and 5C are cross-sectional TEM images of an upper layer (A), a middle layer (B), and a lower layer (C) of the hard carbon film comprising a laminated film.
Figure 5B:
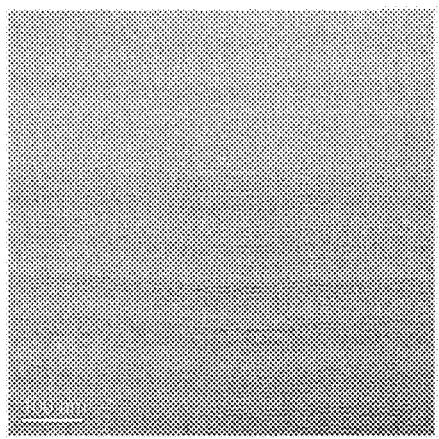
Figure 5C:
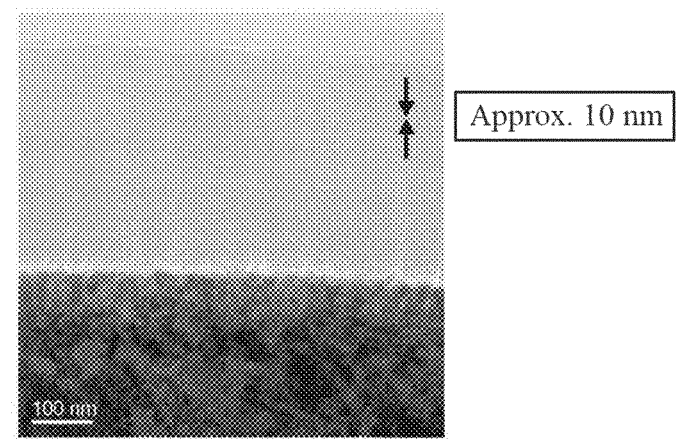

The lower layer 3 comprising an amorphous carbon film was formed on the foundation film 2. The layer was formed by repeating pulse bias voltages of −130 V (ON time: 50 seconds) and 0 V (OFF time: 0.5 seconds or less) at an arc current of 90 A in a high vacuum chamber of $1.0 \times 10^{-3}$ Pa or less using an arc ion plating device with a carbon target installed, until the lamination pitch (thickness per layer) became 10 nm and the total thickness became 0.4 μm. FIG. 5C is a cross-sectional TEM image of the lower layer 3, making it possible to confirm film formation of each layer at a lamination pitch of approximately 10 nm.

The middle layer 4 comprising an amorphous carbon film was formed on the lower layer 3. The layer was formed by alternately switching pulse bias voltages of −130 V and −1800 V each second at an arc current of 120 A in a high vacuum chamber of $1.0 \times 10^{-3}$ Pa or less using the arc ion plating device in the same way as described above and a carbon target, until the lamination pitch (thickness per layer) became 0.2 nm and the total thickness became 1.2 μm. FIG. 5B is a cross-sectional TEM image of the middle layer 4, making it possible to confirm film formation of each layer at a smaller lamination pitch than the other layers.

The upper layer 5 comprising an amorphous carbon film was formed on the middle layer 4. The layer was formed by repeating pulse bias voltages of −1800 V (ON time: 50 seconds) and 0 V (OFF time: 0.5 seconds or less) at an arc current of 120 A in a high vacuum chamber of $1.0 \times 10^{-3}$ Pa or less using the arc ion plating device in the same way as described above, until the lamination pitch (thickness per layer) became 30 nm and the total thickness became 3.2 μm. FIG. 5A is a cross-sectional TEM image of the upper layer 5, making it possible to confirm film formation of each layer at an approximate 30-nm lamination pitch.

The total thickness of the hard carbon film 50 comprising the lower layer 3, the middle layer 4, and the upper layer 5 was 4.8 µm. The hydrogen content of the hard carbon film 50 was 0.5 atom % based on measurement results by an RBS/HFS method. This RBS/HFS method is an abbreviation for Rutherford backscattering spectrometry (RBS) and hydrogen forward scattering spectrometry (HFS). The $sp^2$ component ratio was measured in the thickness direction of the films of the upper layer 5 (analysis points 1 to 8) and the middle layer 4 (analysis points 9 to 11), and the average thereof was found. As a result, the $sp^2$ component ratio of the upper layer 5 was 59.7%, and the $sp^2$ component ratio of the middle layer 4 was 52.7%. The $sp^2$ component ratio of the lower layer 3 (analysis point 12) was 39%, and thus the $sp^2$ component ratio of the upper layer 5 was greater than the $sp^2$ component ratio of the lower layer 3. Further, the area ratio of macroparticles appearing on the surface of the upper layer 5 was 1.7%. FIG. 4 is a surface image of the upper layer 5 showing macroparticles. The Vickers hardness of the upper layer 5 was evaluated upon forming the layer at a thickness of 5 µm and, as a result, was 1294 HV (0.05). A Vickers hardness tester (manufactured by Future-Tech) was used for measurement. The indentation hardness $H_{IT}$ (15-mN load) of the upper layer 5 when measured using the nanoindenter manufactured by Elionix was 14 GPa.

Reference Example 1

Similar to Example 1, a Cr—N coating (wear-resistant coating) and titanium film (foundation film) were formed on the piston ring base material 1. The lower layer 3 comprising an amorphous carbon film was formed thereon. The layer was formed by repeating pulse bias voltages of −130 V (ON time: 50 seconds) and 0 V (OFF time: 0.5 seconds or less) at an arc current of 90 A in a high vacuum chamber of $1.0\times10^{-3}$ Pa or less using the arc ion plating device in the same way as in Example 1, until the lamination pitch (thickness per layer) became 10 nm and the total thickness became 0.1 µm.

The upper layer 5 comprising an amorphous carbon film was formed on the lower layer 3 without providing the middle layer 4. The layer was formed by repeating pulse bias voltages of −1800 V (ON time: 1 second) and 0 V (OFF time: 0.5 seconds or less) at an arc current of 120 A in a high vacuum chamber of $1.0\times10^{-3}$ Pa or less using the arc ion plating device in the same way as described above, until the lamination pitch (thickness per layer) became 0.2 nm and the total thickness became 1.4 µm.

The total thickness of the hard carbon film comprising the lower layer 3 and the upper layer 5 was 1.5 µm. The hydrogen content of the hard carbon film was 0.3 atom % based on measurement results by an RBS/HFS method. Further, the $sp^2$ component ratios of the upper layer 5 and the lower layer 3 were measured at 10 locations at an equal interval in the thickness direction of the films, and the average thereof was found. As a result, the $sp^2$ component ratio of the upper layer 5 was 64% and the $sp^2$ component ratio of the lower layer 3 was 41%, and thus the $sp^2$ component ratio of the upper layer 5 was greater than the $sp^2$ component ratio of the lower layer 3. Further, the Vickers hardness HV of the upper layer 5 was evaluated in the same way as in Example 1 upon forming the layer at a thickness of 5 µm and, as a result, was 1497 HV (0.05). The indentation hardness $H_{IT}$ (15-mN load) of the upper layer 5 was also evaluated in the same way as in Example 1, and was 16 GPa. It should be noted that, in this Reference Example 1, a test sample for accelerated wearing by a slurry that contains diamond particles having an average particle size of 0.25 µm was also prepared. As the test sample, a hard carbon film having a total thickness of 4.4 µm with the thickness of the lower layer 3 and the upper layer 5 constituting the hard carbon film being 0.4 µm and 4.0 µm, respectively, was formed.

Reference Example 2

Similar to Example 1, a Cr—N coating (wear-resistant coating) and titanium film (foundation film) were formed on the piston ring base material 1. A hard carbon foundation film comprising an amorphous carbon film was formed thereon. The film was formed at an arc current of 90 A and a pulse bias voltage of −130 V under the conditions of 12 minutes in a high vacuum chamber of $1.0\times10^{-3}$ Pa or less using the arc ion plating device in the same way as in Example 1 so as to achieve a thickness of 0.2 µm.

A single hard carbon film comprising a laminated film with a 0.2-nm lamination pitch was formed using the same arc ion plating device on the hard carbon foundation film. This film was formed by establishing an arc current of 120 A and alternately applying a predetermined low bias voltage and a predetermined high bias voltage in pulses. Specifically, the film was formed by applying conditions A: a low bias voltage of −140 V and a high bias voltage of −220 V for 1 second each (total: 1000 seconds), and conditions B: a low bias voltage of −150 V and a high bias voltage of −1800 V for 1 second each (total: 350 seconds) in pulses as one cycle, in the order of A and B. It should be noted that, in the end, the film was formed by repeating conditions A and conditions B for 14 cycles.

The total thickness of the hard carbon foundation film and the hard carbon film was 3.5 µm. The hydrogen content of the hard carbon film was 0.3 atom % based on measurement results by an RBS/HFS method. Further, the Vickers hardness HV of the hard carbon film, similar to Example 1, was evaluated as 1710 HV (0.05) upon forming the film at a thickness of 5 µm, and the indentation hardness $H_{IT}$ (15-mN load) of the hard carbon film was 18.5 GPa.

[Measurement of $sp^2$ Component Ratio]

The $sp^2$ component ratio was calculated by the following steps (1) to (5). (1) The EELS spectrum is measured by an EELS analyzer (manufactured by Gatan; model 863GIF Tridiem). The pre-peak area is fit using a linear function, and the post-peak area is fit using a cubic function to the measured EELS spectrum to standardize the peak intensity. (2) Subsequently, the diamond data and the graphite data are compared, and the energy is calibrated with the peak start position aligned. (3) The surface area within a range of 280 eV to 310 eV is found for the calibrated data. (4) The area is divided into two peaks (one being an $sp^2$ peak and the other being a CH and an amorphous peak) within a range of 280 eV to 295 eV, and the peak area near 285 eV is found. (5) The ratio of the surface area within the 280 eV to 310 eV range of (3) above, and the peak area near 285 eV of (4) above is determined. For this ratio, the $sp^2$ component ratio is found from relative values given a graphite value of 100 and a diamond value of 0. The value thus found is the $sp^2$ component ratio. The hard carbon film 50 obtained in Example 1 was analyzed at 10 locations at an equal interval in the thickness direction of the film. The results are shown in Table 1. It should be noted that Table 1 indicates the $sp^2$ component ratio for both graphite and diamond.

TABLE 1

| | Analysis Point | Peak Area (near 285 eV) | Peak Area (280 to 310 eV) | Area Ratio | sp2 Component Ratio |
|---|---|---|---|---|---|
| Example 1 | 1 | 1.47 | 24.02 | 0.061 | 59 |
| | 2 | 1.52 | 24.51 | 0.062 | 60 |
| | 3 | 1.55 | 24.24 | 0.064 | 62 |
| | 4 | 1.59 | 24.44 | 0.065 | 64 |
| | 5 | 1.63 | 24.28 | 0.067 | 66 |
| | 6 | 1.58 | 24.10 | 0.066 | 64 |
| | 7 | 1.59 | 24.46 | 0.065 | 63 |
| | 8 | 1.48 | 24.15 | 0.061 | 60 |
| | 9 | 1.23 | 23.78 | 0.052 | 49 |
| | 10 | 1.26 | 24.00 | 0.053 | 50 |
| | 11 | 1.45 | 24.01 | 0.060 | 59 |
| | 12 | 0.96 | 22.93 | 0.042 | 39 |
| Graphite | — | 2.33 | 23.41 | 0.100 | 100 |
| Diamond | — | 0.11 | 21.91 | 0.005 | 0 |

[Friction and Wear Test (SRV Test)]

A Cr—N coating (wear-resistant coating), a titanium film (the foundation film 2), the lower layer 3, and the hard carbon film 50 were formed in that order in the same manner as in Example 1 and Reference Examples 1 and 2 on the surface (outer peripheral sliding surface 11) of the piston ring base material 1 (material equivalent to an SWOSC-V material in JIS standards, material of Example 1) having a ring diameter y of 80 mm. The obtained sample was subjected to a friction and wear test (SRV test; Schwingungs Reihungund and Verschleiss) in the mode illustrated in FIG. 6, and the presence/absence of abrasion was observed.

The test conditions were as follows. The piston ring was cut to a length of 20 mm and used as a sliding side test piece (pin-type test piece) 20. As an opposing side test piece (disk-type test piece) 21, a test piece having a 24-mm diameter and a 7.9-mm length (with a hardness of HRC 62 or greater) was cut from SUJ2 steel specified as high carbon chromium bearing steel material in JIS G4805 and used to implement an SRV test under the conditions below. It should be noted that the symbol Y in FIG. 6 denotes a sliding direction, and a sliding width in the sliding direction was set to 3 mm.

Tester: SRV tester (refer to FIG. 6)
Load: 500 N
Frequency: 50 Hz
Test temperature: 80° C.
Sliding width: 3 mm
Lubricant: 5W-30, 125 mL/hr
Test time: 10 minutes, 60 minutes, 120 minutes FIGS. 7A to 7G are images showing the SRV test results. FIG. 7A shows the 10-minute test results at 500 N using the sample of Example 1. FIG. 7B shows the 60-minute test results at 500 N using the sample of Example 1. FIG. 7C shows the 600-minute test results at 500 N using the sample of Example 1. FIG. 7D shows the 10-minute test results at 500 N using the sample of Reference Example 1. FIG. 7E shows the 10-minute test results at 500 N using the sample of Reference Example 2. FIG. 7F shows the 60-minute test results at 500 N using the sample of Reference Example 2. FIG. 7G shows the 110-minute test results at 500 N using the sample of Comparative Example 1 described later. The sample of Example 1 showed remarkably excellent wear resistance without the advance of abrasion, even in the 600-minute test at 500 N. On the other hand, in the sample of Reference Example 1, peeling occurred in the 10-minute test at 500 N. Further, in the sample of Reference Example 2, while abrasion did not occur in the 10-minute test at 500 N, abrasion did occur in the 60-minute test at 500 N, although without peeling. Furthermore, in the sample of Comparative Example 1, abrasion occurred in the 110-minute test at 500 N.

Figure 6:
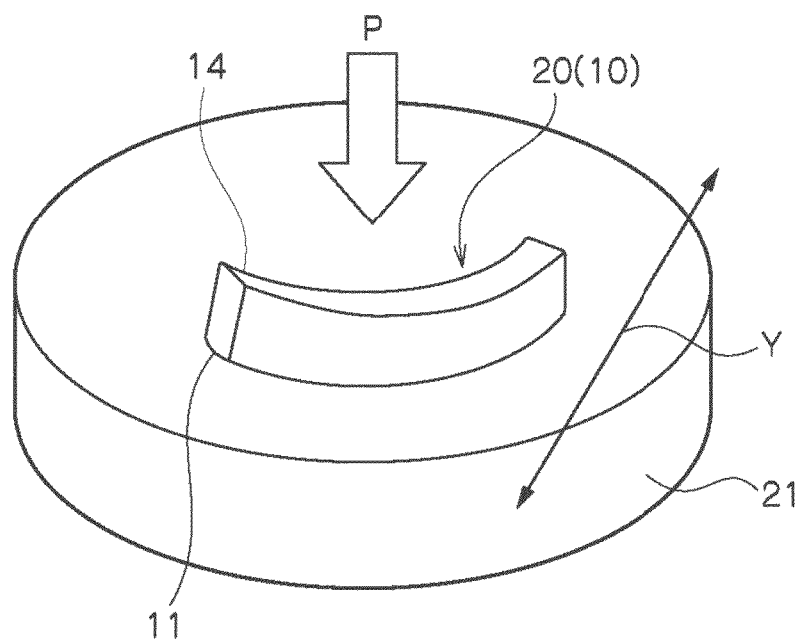
FIG. 6 is a schematic diagram of the principle of a friction and wear test using a disk-type test piece.
Figure 7A:
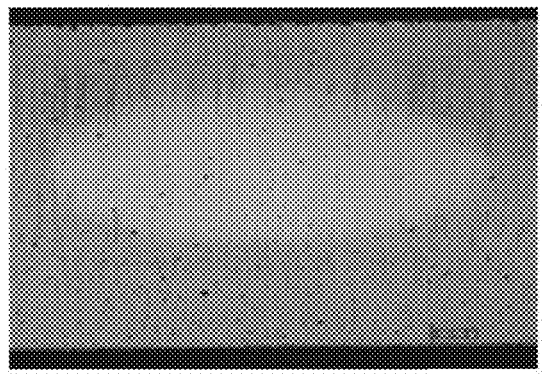
FIGS. 7A, 7B, 7C, 7D, 7E, 7F, and 7G are images showing SRV test results.
Figure 7B:
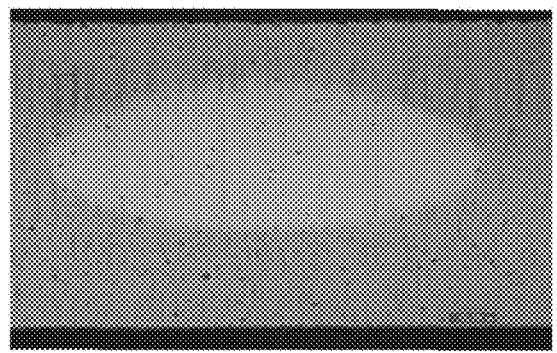
Figure 7C:
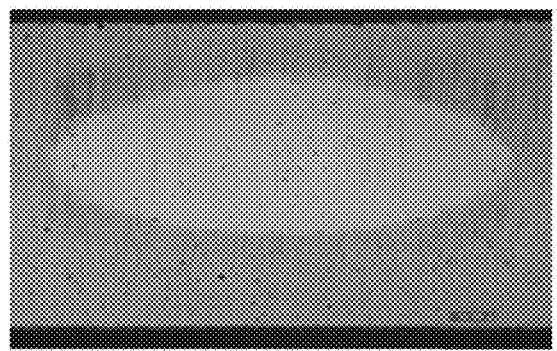
Figure 7D:
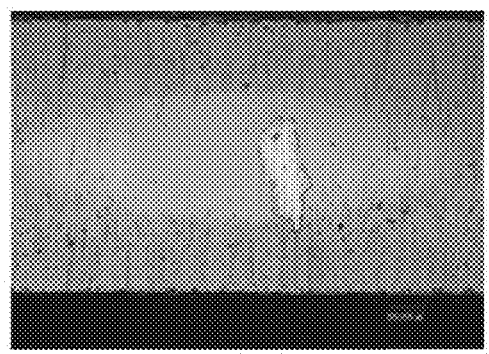
Figure 7E:
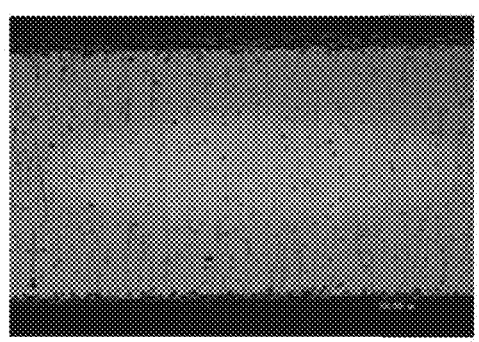
Figure 7F:
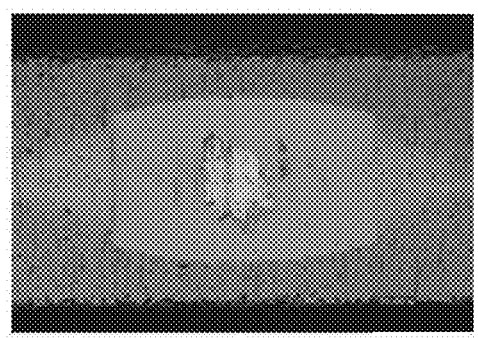
Figure 7G:
Figure 8A:
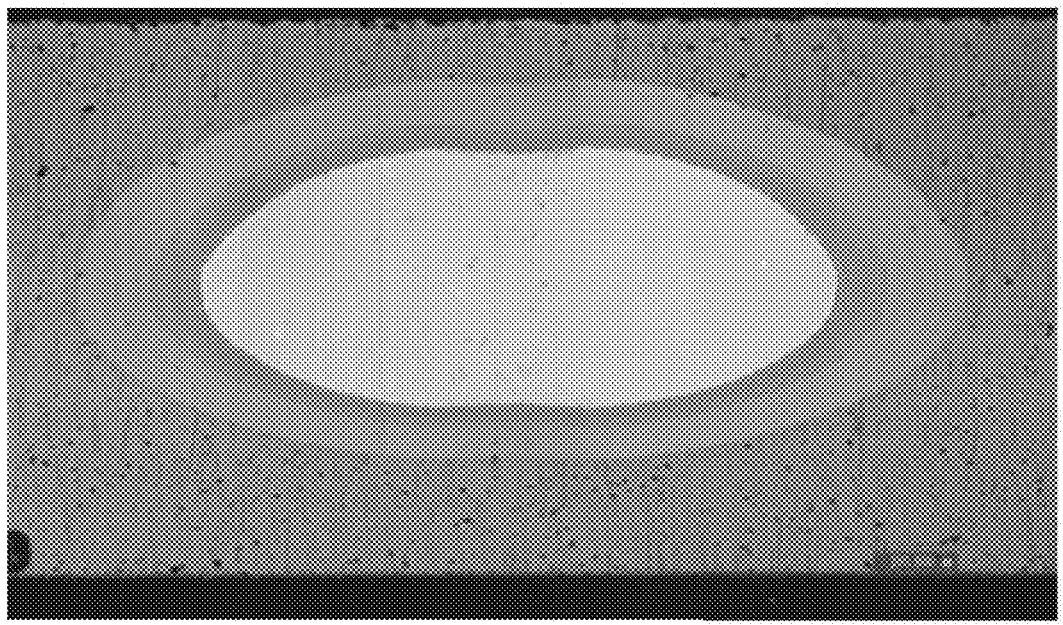
FIGS. 8A and 8B are images showing SRV test results when the test piece was subjected to accelerated wearing by a diamond (average particle size: 0.25 μm) slurry.
Figure 8B:
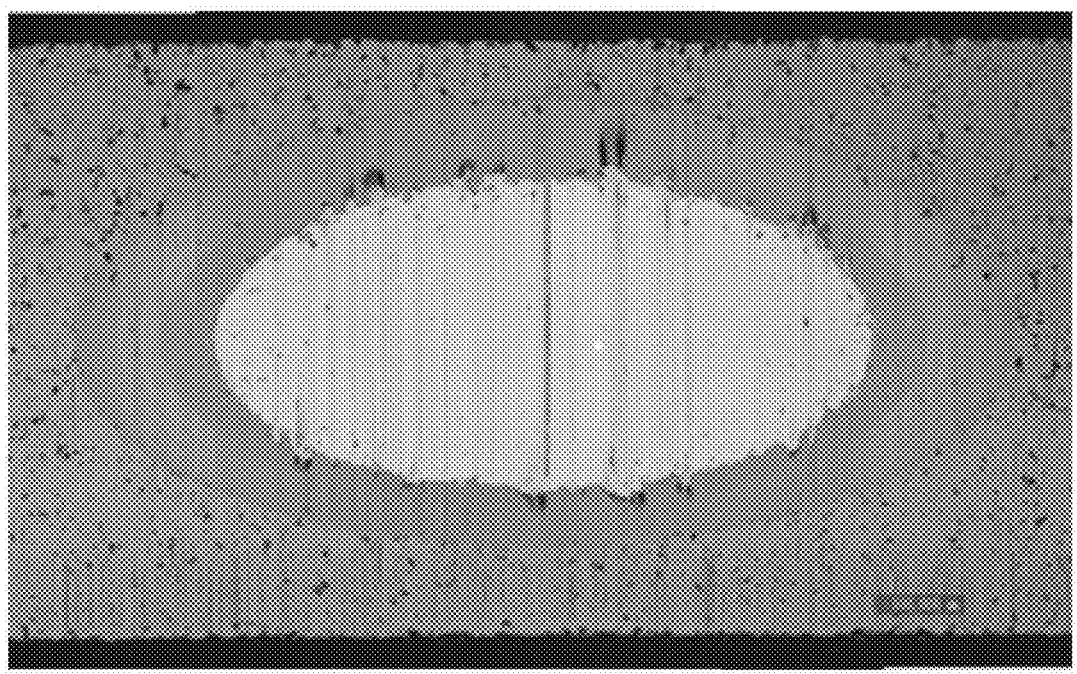

FIGS. 8A and 8B are images showing the results of the SRV test illustrated in FIG. 6 when the sample was subjected to accelerated wearing by a slurry that contains diamond particles having an average particle size of 0.25 μm. FIG. 8A shows the 3-minute test results at 20 N using the sample of Example 1. FIG. 8B shows the 3-minute test results at 20 N using the sample of Reference Example 1. The sample of Example 1 showed excellent wear resistance without swelling or peeling. In Reference Example 1, as shown in the image of FIG. 8B, peeling of the hard carbon film was seen near the borderline between the center white area (wear-resistant coating) and the gray area (hard carbon film comprising the lower layer 3 and the upper layer 5).

It should be noted that the Vickers hardness of the hard carbon film in Example 1 was 1294 HV (0.05) while the Vickers hardness of the hard carbon film in Reference Example 1 was 1497 HV (0.05). The Vickers hardness of the hard carbon film in Reference Example 2 was 1710 HV (0.05). The hard carbon film in Example 1, while decreased in hardness compared to those in Reference Examples 1 and 2, exhibited excellent adhesion and wear resistance, and is thus considered to be improved in toughness.

Examples 2 to 8 and Comparative Examples 1 to 3

In Example 1, the lamination pitch and the total thickness of the lower layer 3, the middle layer 4, and the upper layer 5 constituting the hard carbon film 50 were changed as shown in Table 2 and Table 3. Other than the lamination pitch and the total thickness, the examples were conducted in the same way as in Example 1. It should be noted that the changes in lamination pitch of the lower layer 3 and the upper layer 5 were adjusted by increasing and decreasing the ON time of the pulse bias voltage, and the changes in total thickness of the lower layer 3 and the upper layer 5 were adjusted by the repeated count of the applied pulse bias voltage. Further, the changes in lamination pitch of the middle layer 4 were adjusted by increasing and decreasing the bias voltage value and the ON time of the pulse bias voltage, and the changes in total thickness of the middle layer 4 were adjusted by the repeated count of the applied pulse bias voltage. It should be noted that the lamination pitch and the total thickness of Example 1 are also shown in Table 2.

With regard to the friction and wear test (SRV test) as well, similar to Example 1, a wear test at 500 N and an accelerated wear test by a slurry that contains diamond particles having an average particle size of 0.25 μm were conducted, and the respective results are shown in Table 2 and Table 3. In the SRV test results in the tables, each time at 500 N in Table 2 is the amount of time that abrasion did not occur, and each value in parentheses in Table 3 is the amount of time that abrasion did occur. Further, in the accelerated wear results, A is without peeling, and B is with peeling. It should be noted that the basic film-forming conditions of the hard carbon film 50 (the lower layer 3, the middle layer 4, and the upper layer 5) formed in Examples 2 to 8 and Comparative Examples 1 to 3 were the same as in Example 1, and the hydrogen content, sp² component ratio, Vickers hardness, and indentation hardness were the same or substantially the same as in Example 1.

TABLE 2

|  |  | Examples | | | | | | | |
| --- | --- | --- | --- | --- | --- | --- | --- | --- | --- |
|  |  | 1 | 2 | 3 | 4 | 5 | 6 | 7 | 8 |
| Lower layer | Lamination pitch (nm) | 10 | 10 | 10 | 10 | 30 | 30 | 50 | 3 |
|  | Total thickness (μm) | 0.4 | 0.4 | 0.4 | 0.4 | 0.4 | 0.6 | 0.6 | 0.1 |
| Middle layer | Lamination pitch (nm) | 0.2 | 0.2 | 0.2 | 0.2 | 0.2 | 3 | 5 | 0.2 |
|  | Total thickness (μm) | 1.2 | 0.4 | 0.8 | 0.8 | 0.8 | 1.4 | 1.6 | 1.0 |
| Upper layer | Lamination pitch (nm) | 30 | 30 | 30 | 50 | 50 | 30 | 50 | 3 |
|  | Total thickness (μm) | 3.2 | 6.7 | 6.3 | 13.8 | 13.8 | 6.9 | 15.8 | 2.0 |
| SRV test | Time at 500 N (minutes) | 600 | 600 | 600 | 600 | 600 | 600 | 600 | 600 |
|  | Accelerated wear result | A | A | A | A | A | A | A | A |

TABLE 3

|  |  | Comparative Examples | | | Reference Examples | |
| --- | --- | --- | --- | --- | --- | --- |
|  |  | 1 | 2 | 3 | 1 | 2 |
| Lower layer | Lamination pitch (nm) | 1 | 10 | 3 | 10 | — |
|  | Total thickness (μm) | 0.1 | 0.4 | 0.2 | 0.4 | — |
| Middle layer | Lamination pitch (nm) | 0.2 | 20 | 5 | — | — |
|  | Total thickness (μm) | 1.2 | 1.6 | 1.6 | — | — |
| Upper layer | Lamination pitch (nm) | 30 | 30 | 30 | 0.2 | 0.2 |
|  | Total thickness (μm) | 3.2 | 6.7 | 6.3 | 1.4 | 3.5 |
| SRV test | Time at 500 N (minutes) | (110) | (360) | (300) | (10) | (60) |
|  | Accelerated wear result | A | A | A | A | A |

DESCRIPTIONS OF REFERENCE NUMERALS

1 Piston ring base material
2 Foundation film
50 Hard carbon film
3 Lower layer
4 Middle layer
5 Upper layer
10, 10A, 10B Piston ring
11 Sliding surface (Outer peripheral sliding surface)
12 Top surface
13 Bottom surface
14 Inner peripheral surface
20 Sliding side test piece (Pin-type test piece)
21 Opposing side test piece (Disk-type test piece)
P Load

What is claimed is:

1. A piston ring, comprising:
a hard carbon film formed on at least an outer peripheral sliding surface of a piston ring base material;
the hard carbon film being a laminated film comprising a plurality of layers, the plurality of layers including a lower layer closest to the piston ring base material, a middle layer, and an upper layer farthest from the piston ring base material;
the lower layer has a lamination pitch within a range of 3 nm to 50 nm inclusive, the middle layer has a lamination pitch less than that of the lower layer, and the upper layer has a lamination pitch within the same range as that of the lower layer and greater than that of the middle layer.

2. The piston ring according to claim 1, wherein
the hard carbon film has an $sp^2$ component ratio within a range of 35% to 80% inclusive, measured in a TEM-EELS spectrum formed by combining electron energy loss spectroscopy (EELS) with a transmission electron microscope (TEM), and a hydrogen content within a range of 0.1 atom % to 5 atom % inclusive.

3. The piston ring according to claim 1, wherein
an $sp^2$ component ratio of the upper layer is greater than an $sp^2$ component ratio of the lower layer, and an $sp^3$ component ratio of the upper layer is less than an $sp^3$ component ratio of the lower layer.

4. The piston ring according to claim 1, wherein
the lamination pitch of the middle layer is less than the lamination pitches of the upper layer and the lower layer and within a range of 0.1 nm to 5 nm inclusive.

5. The piston ring according to claim 1, wherein
an amount of macroparticles appearing on a surface of the hard carbon film is within a range of 0.1% to 10% inclusive by area ratio.

6. The piston ring according to claim 1, wherein
a hardness of the upper layer constituting the hard carbon film is within a range of 10 GPa to 20 GPa inclusive at an indentation hardness HIT (15-mN load) when measured by a nanoindentation method.

7. A manufacturing method for a piston ring comprising a hard carbon film that is a laminated film formed on at least an outer peripheral sliding surface of a piston ring base material by a physical vapor deposition method, the manufacturing method for a piston ring comprising the steps of:
forming a lower layer with a lamination pitch within a range of 3 nm to 50 nm inclusive, forming a middle layer with a lamination pitch less than that of the lower layer, and forming an upper layer with a lamination pitch within the same range as that of the lower layer and greater than that of the middle layer.

8. The manufacturing method for a piston ring according to claim 7, wherein
the upper layer, the middle layer, and the lower layer constituting the hard carbon film are formed by alternately applying at least two different bias voltages.

* * * * *